United States Patent
Lee et al.

(10) Patent No.: US 12,089,651 B2
(45) Date of Patent: Sep. 17, 2024

(54) AEROSOL GENERATING DEVICE SENSING CONTACT OF USER TO ACTIVATE HEATER AND OPERATION METHOD THEREOF

(71) Applicant: KT&G CORPORATION, Daejeon (KR)

(72) Inventors: Won Kyeong Lee, Guri-si (KR); Min Kyu Kim, Daejeon (KR); Jong Sub Lee, Seongnam-si (KR); Byung Sung Cho, Gwangmyeong-si (KR)

(73) Assignee: KT&G CORPORATION, Daejeon (KR)

( * ) Notice: Subject to any disclaimer, the term of this patent is extended or adjusted under 35 U.S.C. 154(b) by 606 days.

(21) Appl. No.: 17/296,819

(22) PCT Filed: Dec. 10, 2020

(86) PCT No.: PCT/KR2020/018110
§ 371 (c)(1),
(2) Date: May 25, 2021

(87) PCT Pub. No.: WO2021/201375
PCT Pub. Date: Oct. 7, 2021

(65) Prior Publication Data
US 2022/0125123 A1    Apr. 28, 2022

(30) Foreign Application Priority Data
Mar. 30, 2020   (KR) ........................ 10-2020-0038564

(51) Int. Cl.
*A24F 40/51*    (2020.01)
*A24F 40/46*    (2020.01)
(Continued)

(52) U.S. Cl.
CPC .............. *A24F 40/51* (2020.01); *A24F 40/46* (2020.01); *A24F 40/53* (2020.01); *A24F 40/60* (2020.01)

(58) Field of Classification Search
CPC .......... A24F 40/46; A24F 40/51; A24F 40/53; A24F 40/60
(Continued)

(56) References Cited

U.S. PATENT DOCUMENTS

| 5,261,424 A | 11/1993 | Sprinkel, Jr. |
| 9,423,152 B2 | 8/2016 | Ampolini et al. |

(Continued)

FOREIGN PATENT DOCUMENTS

| CN | 102970885 A | 3/2013 |
| CN | 209732610 U | 12/2019 |

(Continued)

OTHER PUBLICATIONS

Extended European Search Report dated Dec. 14, 2021 in European Application No. 20894940.4.
(Continued)

*Primary Examiner* — Abdullah A Riyami
*Assistant Examiner* — Vladimir Imas
(74) *Attorney, Agent, or Firm* — Sughrue Mion, PLLC

(57) ABSTRACT

An aerosol generating device includes a battery, a capacitive sensor, a controller, a first conductive element, a second conductive element, and a heater, wherein the controller is configured to control power supplied from the battery to the heater based on an order of a first time point at which the capacitive sensor senses contact of a user through the first conductive element and a second time point at which the capacitive sensor senses contact of the user through the second conductive element.

12 Claims, 6 Drawing Sheets

(51) Int. Cl.
*A24F 40/53* (2020.01)
*A24F 40/60* (2020.01)

(58) Field of Classification Search
USPC .......................................................... 131/329
See application file for complete search history.

(56) References Cited

U.S. PATENT DOCUMENTS

| | | | |
|---|---|---|---|
| 10,136,673 | B2 | 11/2018 | Mironov |
| 2015/0053214 | A1 | 2/2015 | Alarcon et al. |
| 2015/0216237 | A1* | 8/2015 | Wensley ................. A24F 40/48 |
| | | | 131/273 |
| 2017/0157341 | A1 | 6/2017 | Pandya et al. |
| 2017/0258142 | A1 | 9/2017 | Hatton et al. |
| 2017/0359856 | A1 | 12/2017 | Qiu |
| 2018/0213843 | A1 | 8/2018 | Mironov |
| 2018/0352864 | A1 | 12/2018 | Takeuchi et al. |
| 2019/0183185 | A1 | 6/2019 | Manas et al. |
| 2019/0380390 | A1 | 12/2019 | Jeong et al. |
| 2021/0289845 | A1* | 9/2021 | Silvestrini ............... A24F 40/46 |
| 2022/0125123 | A1* | 4/2022 | Lee ......................... A24F 40/60 |
| 2022/0125124 | A1* | 4/2022 | Cho ........................ A24F 40/53 |
| 2022/0354173 | A1* | 11/2022 | Choi ........................ A24F 40/10 |
| 2023/0061288 | A1* | 3/2023 | Lee .......................... A24F 40/50 |
| 2023/0086697 | A1* | 3/2023 | Fujinaga ................. A24F 40/42 |
| | | | 131/329 |

FOREIGN PATENT DOCUMENTS

| | | |
|---|---|---|
| JP | 05-212100 A | 8/1993 |
| JP | 10-2015-0130458 A | 11/2015 |
| JP | 2020-503902 A | 2/2020 |
| KR | 10-2016-0140608 A | 12/2016 |
| WO | 2016/009202 A1 | 1/2016 |
| WO | 2019/104277 A1 | 5/2019 |

OTHER PUBLICATIONS

Office Action issued Apr. 14, 2023 in Chinese Application No. 202080010789.2.
International Search Report for PCT/KR2020/018110 dated Apr. 2, 2021 [PCT/ISA/210].
Written Opinion for PCT/KR2020/018110 dated Apr. 2, 2021 [PCT/ISA/237].

* cited by examiner

[Figure 1]
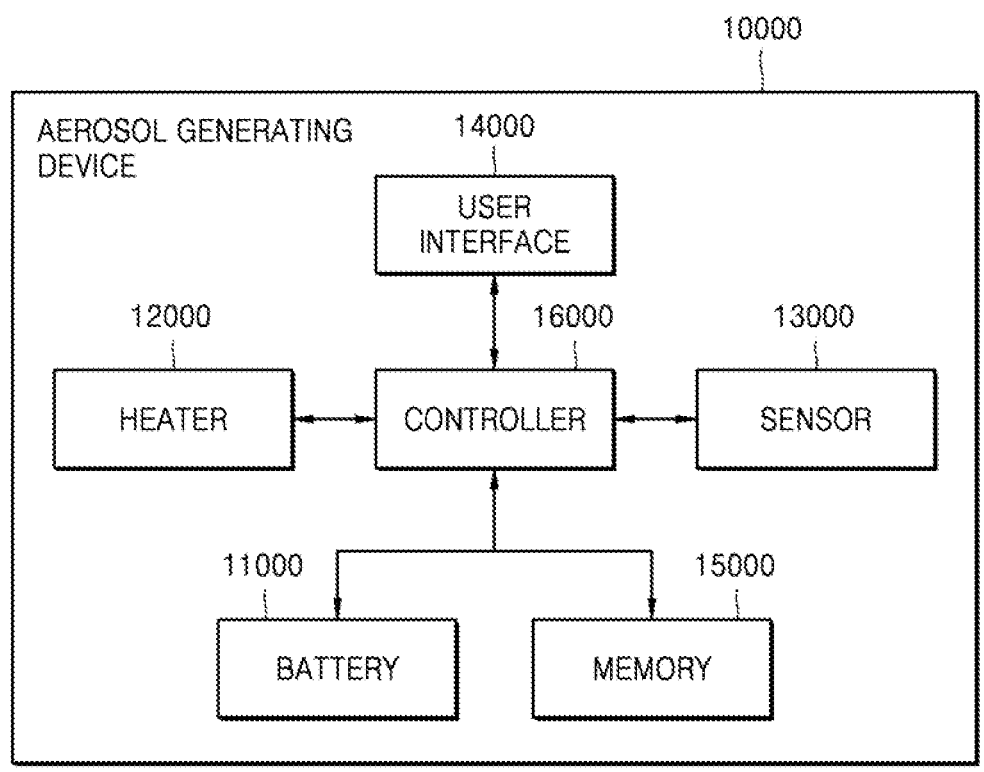

[Figure 2]
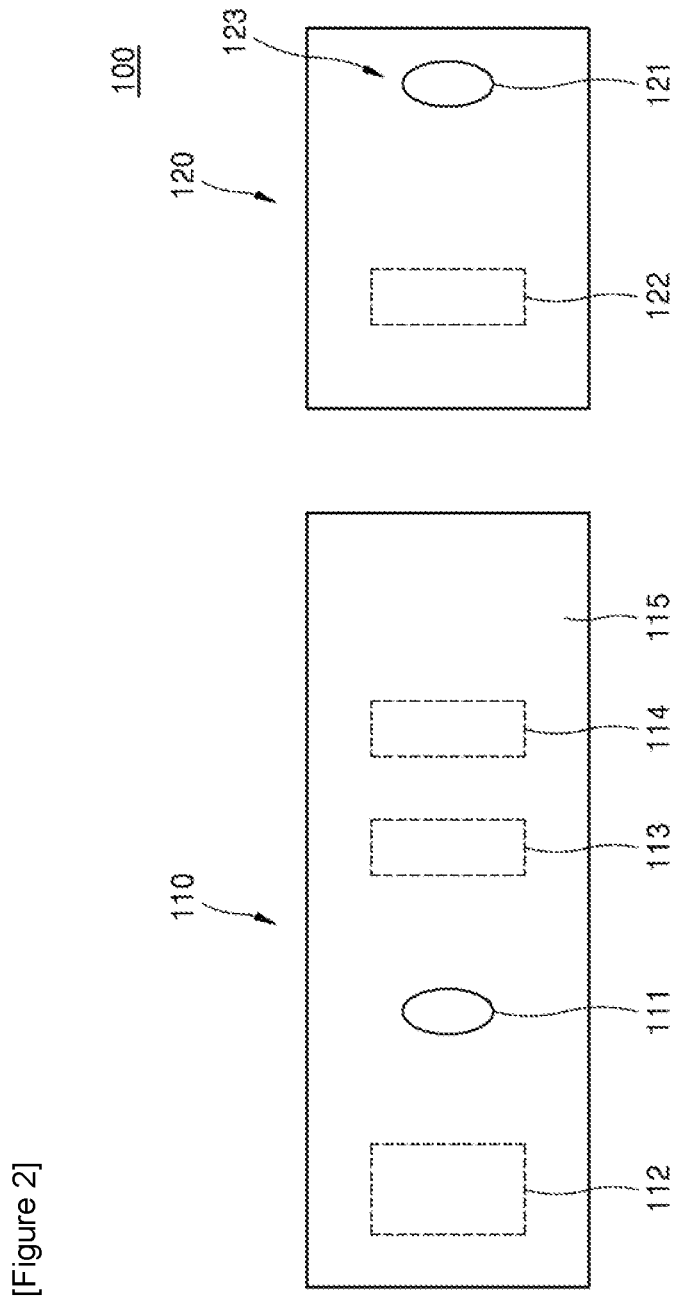

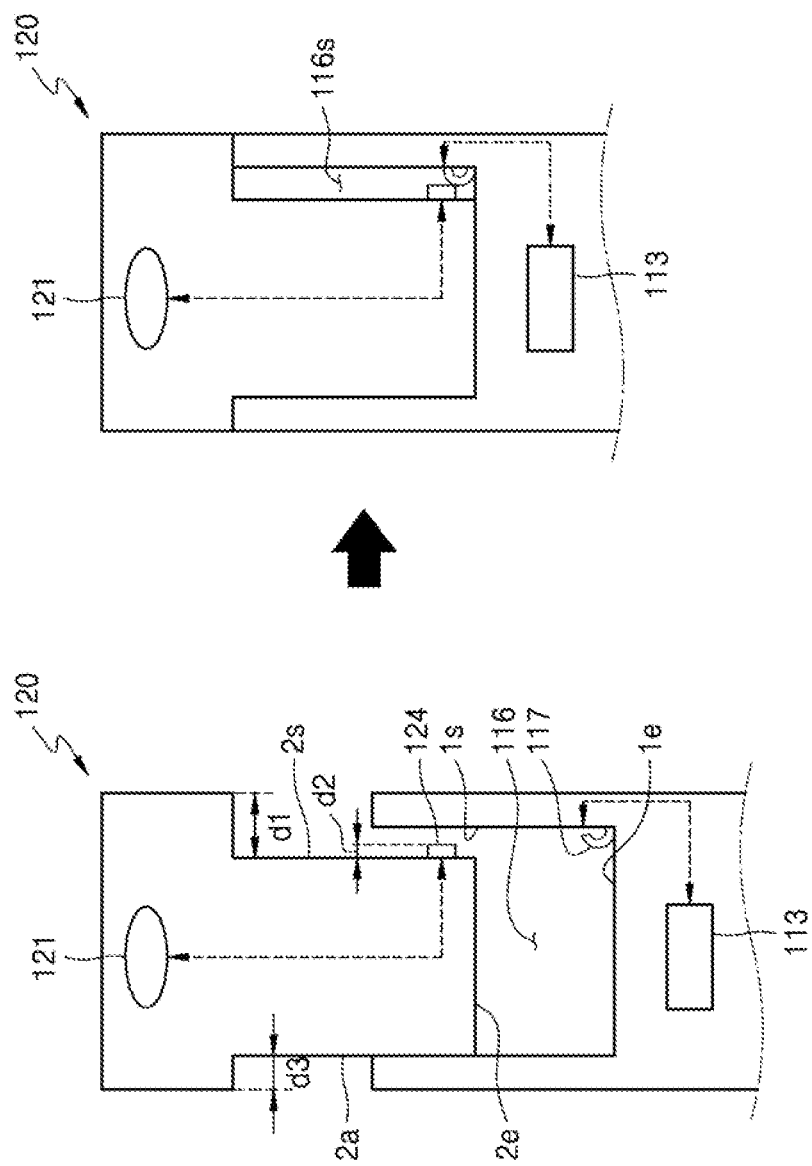
[Figure 3]

[Figure 4]
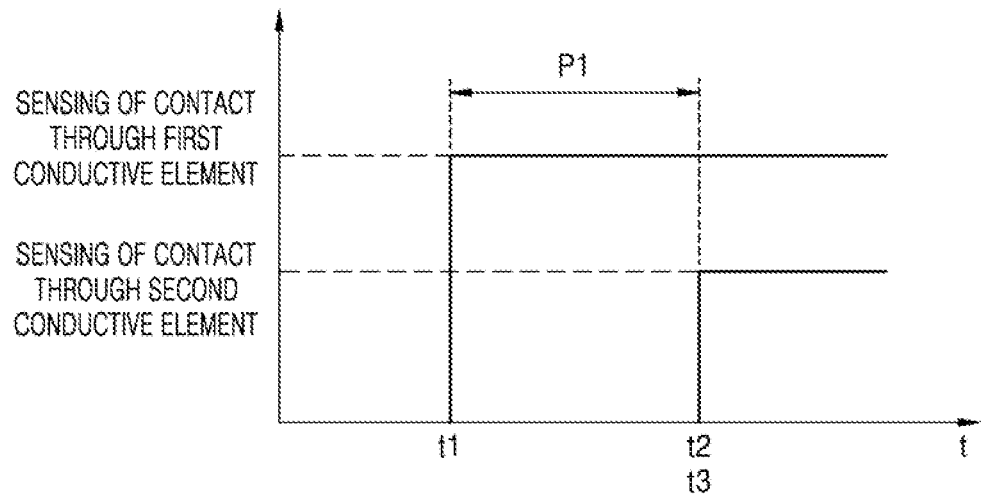
[Figure 5]
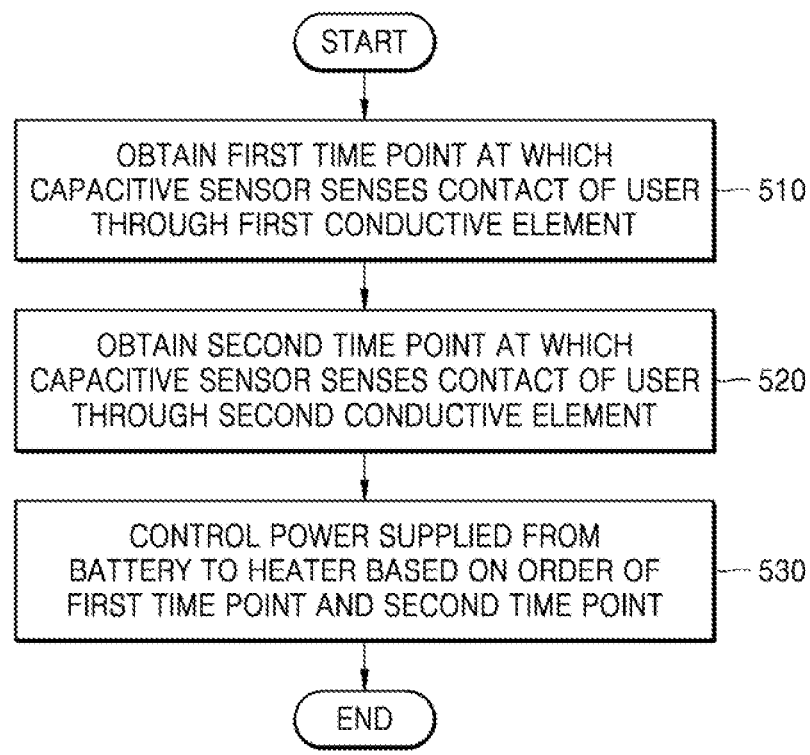

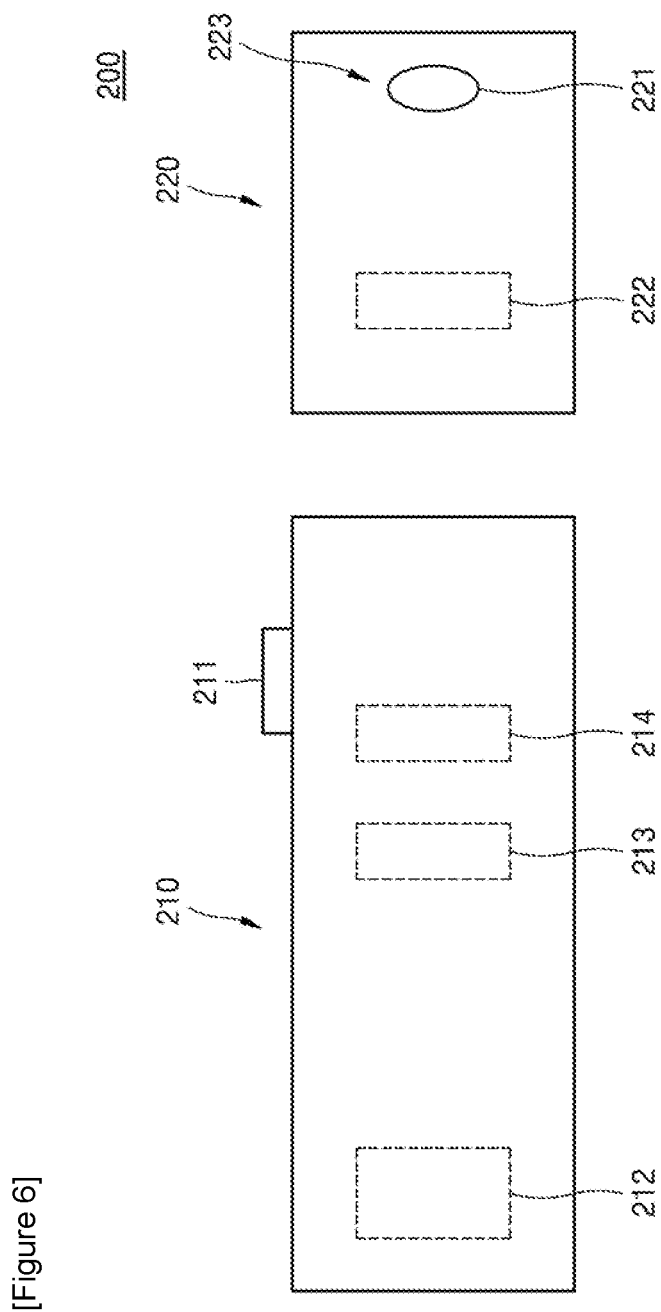
[Figure 6]

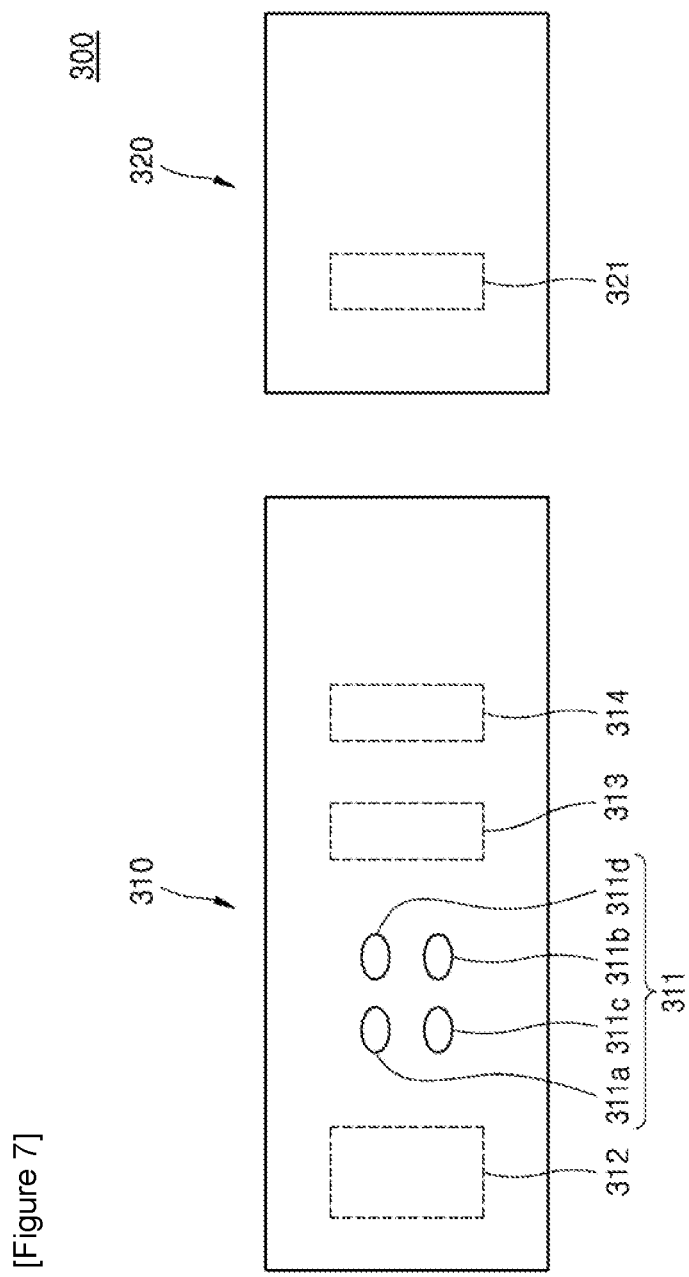
[Figure 7]

AEROSOL GENERATING DEVICE SENSING CONTACT OF USER TO ACTIVATE HEATER AND OPERATION METHOD THEREOF

TECHNICAL FIELD

Embodiments of present disclosure relate to an aerosol generating device sensing contact of a user to activate a heater, and an operation method thereof.

BACKGROUND ART

Recently, the demand for alternative methods for overcoming the shortcomings of general cigarettes has increased. For example, there is an increasing demand for a method of generating aerosols by heating an aerosol generating material, rather than by combusting cigarettes.

DISCLOSURE

Technical Problem

There is a need to prevent an aerosol generating device from being activated due to an action of a user contacting the aerosol generating device for reasons other than smoking.

The technical problems of the present disclosure are not limited to the above description, and other technical problems may be understood based on embodiments to be described hereinafter.

Technical Solution

Embodiments of the present disclosure provide an aerosol generating device including a heater that starts pre-heating or is activated when contact of a user is made in a particular manner.

According to a first aspect of the present disclosure, an aerosol generating device may be provided, the aerosol generating device including a battery, a capacitive sensor, a controller, a first conductive element, a second conductive element, and a heater, wherein the controller controls power supplied from the battery to the heater based on an order of a first time point at which the capacitive sensor senses contact of a user through the first conductive element, and a second time point at which the capacitive sensor senses contact of the user through the second conductive element.

Advantageous Effects

According to embodiments of the present disclosure, an aerosol generating device may be activated only when a user contacts the aerosol generating device for smoking.

Effects of embodiments of the present disclosure are not limited by the above descriptions, and more various effects may be provided by embodiments of the present disclosure.

DESCRIPTION OF DRAWINGS

FIG. 1 is a block diagram illustrating hardware components of an aerosol generating device according to an embodiment;

FIG. 2 is a diagram for explaining an aerosol generating device according to an embodiment;

FIG. 3 is a diagram for explaining coupling of a cartridge and a main body, according to an embodiment;

FIG. 4 is a diagram for explaining a method of activating a heater based on a time point at which an aerosol generating device senses contact of a user, according to an embodiment;

FIG. 5 is a flowchart illustrating an operation method of an aerosol generating device according to an embodiment;

FIG. 6 is a diagram for explaining an aerosol generating device according to another embodiment; and FIG. 7 is a diagram for explaining an aerosol generating device according to another embodiment.

BEST MODE

According to one or more embodiments, an aerosol generating device is provided. The aerosol generating device includes: a battery, a capacitive sensor, a controller, a first conductive element, a second conductive element, and a heater, wherein the controller is configured to control power supplied from the battery to the heater based on an order of a first time point at which the capacitive sensor senses contact of a user through the first conductive element, and a second time point at which the capacitive sensor senses contact of the user through the second conductive element.

According to an embodiment, the aerosol generating device further includes: a main body including the battery, the capacitive sensor, the controller, and the first conductive element; and a cartridge including the second conductive element and the heater, wherein the cartridge is configured to be detachably coupled to the main body.

According to an embodiment, at least a portion of the cartridge forms a mouthpiece, the second conductive element is arranged on the mouthpiece such that the capacitive sensor is able to sense contact of lips of the user on the mouthpiece via the second conductive element, the main body further includes a housing for holding by the user, and the first conductive element is arranged on the housing such that the capacitive sensor is able to sense contact with a hand of the user on the housing via the first conductive element.

According to an embodiment, the main body further includes a first contact terminal, and the cartridge further includes a second contact terminal that is configured to be electrically connected to the first contact terminal such that the second conductive element is electrically connected to the capacitive sensor.

According to an embodiment, the second contact terminal is formed to protrude, and the first contact terminal is configured to be at least partially pressed by the second contact terminal as the cartridge is coupled to the main body, thereby electrically connecting the second conductive element to the capacitive sensor.

According to an embodiment, at least a portion of a side wall of the cartridge, on which the second contact terminal is arranged, is formed to protrude more than the second contact terminal.

According to an embodiment, the main body further includes an accommodation space that is configured to receive at least a portion of the cartridge, and the first contact terminal is arranged at an end portion of the accommodation space, opposite to an opening portion of the accommodation space.

According to an embodiment, the controller is configured to, based on the second time point being after the first time point, control the power from the battery to the heater such that the heater is activated.

According to an embodiment, the controller is configured to, based on the first time point being at a same time as or a later time than the second time point, control the power from the battery to the heater such that the heater is not activated.

According to an embodiment, the controller is configured to, based on the second time point being after the first time point and based on the capacitive sensor sensing, through the first conductive element, that contact of the user is maintained from the first time point to the second time point, control the power supplied from the battery to the heater such that the heater is activated.

According to an embodiment, the controller is configured to, based on the second time point being after a predetermined time after the first time point, control the power supplied from the battery to the heater such that the heater is activated.

*27 According to one or more embodiments, an operation method of an aerosol generating device is provided. The operation method includes: sensing, by the aerosol generating device, first contact of a user through a first conductive element of the aerosol generating device; sensing, by the aerosol generating device, second contact of the user through a second conductive element of the aerosol generating device; and controlling, by the aerosol generating device, power supplied from a battery to a heater based on an order of sensing the first contact and the second contact.

According to an embodiment, the controlling includes controlling, based on the second contact being sensed after the first contact, the power supplied from the battery to the heater such that the heater is activated.

According to an embodiment, the controlling includes controlling, based on the first contact being sensed at a same time as or a later time than the second contact, the power supplied from the battery to the heater such that the heater is not activated.

MODE FOR INVENTION

With respect to the terms used to describe various embodiments, general terms which are currently and widely used are selected in consideration of functions of structural elements in the various embodiments of the present disclosure. However, meanings of the terms can be changed according to intention, a judicial precedence, the appearance of new technology, and the like. In addition, in certain cases, a term which is not commonly used can be selected. In such a case, the meaning of the term will be described in detail at the corresponding portion in the description of the present disclosure. Therefore, the terms used to describe the various embodiments of the present disclosure should be defined based on the meanings of the terms and the descriptions provided herein.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element is referred to as being "over," "above," "on," "below," "under," "beneath," "connected to" or "coupled to" another element, it can be directly over, above, on, below, under, beneath, connected or coupled to the other element or intervening elements may be present. In contrast, when an element is referred to as being "directly over," "directly above," "directly on," "directly below," "directly under," "directly beneath," "directly connected to" or "directly coupled to" another element, there are no intervening elements present.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and/or operation and can be implemented by hardware components or software components and combinations thereof.

Hereinafter, embodiments of the present disclosure will now be described more fully with reference to the accompanying drawings, such that one of ordinary skill in the art may easily work the present disclosure. Embodiments of the present disclosure may, however, be embodied in many different forms and should not be construed as being limited to the example embodiments set forth herein.

Hereinafter, embodiments of the present disclosure will be described in detail with reference to the drawings.

FIG. 1 is a block diagram illustrating hardware components of an aerosol generating device according to an embodiment.

Referring to FIG. 1, an aerosol generating device 10000 may include a battery 11000, a heater 12000, at least one sensor 13000, a user interface 14000, a memory 15000, and a controller 16000. However, the internal structure of the aerosol generating device 10000 is not limited to the structures illustrated in FIG. 1. According to embodiments of the aerosol generating device 10000, it will be understood by one of ordinary skill in the art that some of the hardware components shown in FIG. 1 may be omitted or new components may be added.

In an embodiment, the aerosol generating device 10000 may consist of only a main body, in which case hardware components included in the aerosol generating device 10000 are located in the main body. In another embodiment, the aerosol generating device 10000 may comprise or consist of a main body and a cartridge, in which case hardware components included in the aerosol generating device 10000 are located separately in the main body and the cartridge. Alternatively, at least some of hardware components included in the aerosol generating device 10000 may be located in the main body and the cartridge, respectively.

Hereinafter, an operation of each of the components will be described without being limited to location in a particular space in the aerosol generating device 10000.

The battery 11000 supplies electric power to be used for the aerosol generating device 10000 to operate. In other words, the battery 11000 may supply power such that the heater 12000 may be heated. In addition, the battery 11000 may supply power required for operation of other hardware components included in the aerosol generating device 10000, that is, the at least one sensor 13000, the user interface 14000, the memory 15000, and the controller 16000. The battery 11000 may be a rechargeable battery or a disposable battery. For example, the battery 11000 may be a lithium polymer (LiPoly) battery, but is not limited thereto.

The heater 12000 receives power from the battery 11000 under the control of the controller 16000. The heater 12000 may receive power from the battery 11000 and heat a cigarette inserted into the aerosol generating device 10000, or heat the cartridge mounted on the aerosol generating device 10000.

The heater 12000 may be located in the main body of the aerosol generating device 10000. Alternatively, when the aerosol generating device 10000 comprises or consists of the main body and the cartridge, the heater 12000 may be located in the cartridge. When the heater 12000 is located in the cartridge, the heater 12000 may receive power from the battery 11000 located in at least one of the main body and the cartridge.

The heater 12000 may be formed of any suitable electrically resistive material. For example, the suitable electrically resistive material may be a metal or a metal alloy including titanium, zirconium, tantalum, platinum, nickel, cobalt, chromium, hafnium, niobium, molybdenum, tungsten, tin, gallium, manganese, iron, copper, stainless steel, or nichrome, but is not limited thereto. In addition, the heater 12000 may be implemented by a metal wire, a metal plate on which an electrically conductive track is arranged, or a ceramic heating element, but is not limited thereto.

In an embodiment, the heater 12000 may be a component included in the cartridge. The cartridge may include the heater 12000, the liquid delivery element, and the liquid storage. The aerosol generating material accommodated in the liquid storage may be moved to the liquid delivery element, and the heater 12000 may heat the aerosol generating material absorbed by the liquid delivery element, thereby generating aerosol. For example, the heater 12000 may include a material such as nickel chromium and may be wound around or arranged adjacent to the liquid delivery element.

In another embodiment, the heater 12000 may heat the cigarette inserted into the accommodation space of the aerosol generating device 10000. As the cigarette is accommodated in the accommodation space of the aerosol generating device 10000, the heater 12000 may be located inside and/or outside the cigarette. Accordingly, the heater 12000 may generate aerosol by heating the aerosol generating material in the cigarette.

Meanwhile, the heater 12000 may include an induction heater. The heater 12000 may include an electrically conductive coil for heating a cigarette or the cartridge in an induction heating method, and the cigarette or the cartridge may include a susceptor which may be heated by the induction heater.

The aerosol generating device 10000 may include at least one sensor 13000. A result sensed by the at least one sensor 13000 is transmitted to the controller 16000, and the controller 16000 may control the aerosol generating device 10000 to perform various functions such as controlling the operation of the heater 12000, restricting smoking, determining whether a cigarette (or a cartridge) is inserted, and displaying a notification.

For example, the at least one sensor 13000 may include a puff detecting sensor. The puff detecting sensor may detect a user's puff based on any one of a temperature change, a flow change, a voltage change, and a pressure change.

In addition, the at least one sensor 13000 may include a temperature sensor. The temperature sensor may detect a temperature at which the heater 12000 (or an aerosol generating material) is heated. The aerosol generating device 10000 may include a separate temperature sensor for sensing a temperature of the heater 12000, or the heater 12000 itself may serve as a temperature sensor instead of including a separate temperature sensor. Alternatively, a separate temperature sensor may be further included in the aerosol generating device 10000 while the heater 12000 serves as a temperature sensor.

In addition, the at least one sensor 13000 may include a capacitive sensor. The capacitive sensor may be a proximity sensor that senses a nearby object by using capacitance, a contact sensor that senses a contact of an object, or the like, but is not limited thereto.

The user interface 14000 may provide the user with information about the state of the aerosol generating device 10000. The user interface 14000 may include various interfacing devices, such as a display or a lamp for outputting visual information, a motor for outputting haptic information, a speaker for outputting sound information, input/output (I/O) interfacing units (for example, a button or a contact screen) for receiving information input from the user or outputting information to the user, terminals for performing data communication or receiving charging power, and communication interfacing modules for performing wireless communication (for example, Wi-Fi, Wi-Fi direct, Bluetooth, near-field communication (NFC), etc.) with external devices.

However, according to an embodiment, the aerosol generating device 10000 may be implemented by selecting only some of the above-described various interfacing devices.

The memory 15000 may be a hardware component configured to store various pieces of data processed in the aerosol generating device 10000, and the memory 15000 may store data processed or to be processed by the controller 16000. The memory 15000 may include various types of memories, such as random access memory (e.g. dynamic random access memory (DRAM), static random access memory (SRAM), etc.), read-only memory (ROM), electrically erasable programmable read-only memory (EEPROM), etc.

The memory 15000 may store an operation time of the aerosol generating device 10000, the maximum number of puffs, the current number of puffs, at least one temperature profile, data on a user's smoking pattern, etc.

The controller 16000 is a hardware component configured to control general operations of the aerosol generating device 10000. The controller 16000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor may be implemented in other forms of hardware.

The controller 16000 analyzes a result of the sensing by at least one sensor 13000, and controls processes that are to be performed subsequently.

The controller 16000 may control power supplied to the heater 12000 so that the operation of the heater 12000 is started or terminated, based on the result of the sensing by the at least one sensor 13000. In addition, based on the result of the sensing by the at least one sensor 13000, the controller 16000 may control the amount of power supplied to the heater 12000 and the time at which the power is supplied, so that the heater 12000 is heated to a predetermined temperature or maintained at an appropriate temperature.

In an embodiment, the controller 16000 may set a mode of the heater 12000 to a pre-heating mode to start the operation of the heater 12000 after sensing contact of a user through the capacitive sensor. In addition, the controller 16000 may switch the mode of the heater 12000 from the pre-heating mode to an operation mode after detecting a user's puff by using the puff detecting sensor. In addition, the controller 16000 may stop supplying power to the heater 12000 when the number of puffs reaches a preset number after counting the number of puffs by using the puff detecting sensor.

The controller 16000 may control the user interface 14000 based on the result of the sensing by the at least one sensor 13000. For example, when the number of puffs reaches the preset number after counting the number of puffs by using the puff detecting sensor, the controller 16000 may notify the user by using at least one of a lamp, a motor or a speaker that the aerosol generating device 10000 will soon be terminated.

Although omitted below, descriptions made with reference to FIG. 1 may also be applied to an aerosol generating device and an operation method thereof described below.

FIG. 2 is a diagram for explaining an aerosol generating device according to an embodiment.

In an embodiment, an aerosol generating device 100 may include a main body 110 and a cartridge 120. The cartridge 120 may be detachably coupled to the main body 110.

The main body 110 may include a first conductive element 111, a battery 112, a capacitive sensor 113, a controller 114, and a housing 115. In another embodiment, the capacitive sensor 113 may be arranged in the cartridge 120.

The first conductive element 111 may be arranged outside the housing 115. The first conductive element 111 may be arranged in or on a portion of the housing 115 that a user holds with a hand.

When the user holds the aerosol generating device 100, the user's hand and the first conductive element 111 come into contact, so that the capacitive sensor 113 may sense the contact of the user.

The cartridge 120 may include a second conductive element 121 and a heater 122. At least a portion of the cartridge 120 may form a mouthpiece 123.

The second conductive element 121 may be arranged on the mouthpiece 123. The second conductive element 121 may be arranged at a portion of which the user bites the cartridge 120 with lips.

The second conductive element 121 may be arranged on one surface of the cartridge 120. Alternatively, the second conductive element 121 may be arranged on opposite surfaces of the cartridge 120 to contact both upper and lower lips of the user.

When the user bites the mouthpiece 123, the user's lips and the second conductive element 121 come into contact, so that the capacitive sensor 113 may sense contact of the user.

The size, shape, color, configuring material, or the like of the first conductive element 111 and the second conductive element 121 are not limited. For example, the first conductive element 111 and the second conductive element 121 may be formed in a shape and color that are easy for the user to visually identify. For example, the first conductive element 111 and the second conductive element 121 may be formed in a size that is easy for the user to contact. For example, the first conductive element 111 and the second conductive element 121 may be made of a material having conductivity such as copper, iron, aluminum, or the like.

The controller 114 may control power supplied from the battery 112 to the heater 122 based on an order of a first time point at which the capacitive sensor 113 senses the contact of the user through the first conductive element 111, and a second time point at which the capacitive sensor 113 senses contact of the user through the second conductive element 121.

FIG. 3 is a diagram for explaining a coupling of a cartridge and a main body, according to an embodiment.

The main body 110 may include a first contact terminal 117. The cartridge 120 may include a second contact terminal 124 that is configured to be electrically connected to the first contact terminal 117 such that the second conductive element 121 is electrically connected to the capacitive sensor 113.

The main body 110 may include an accommodation space 116 into which at least a portion of the cartridge 120 is inserted. The first contact terminal 117 may be arranged at an end portion (close to a bottom wall 1*e*) opposite to an opening portion of the accommodation space 116. The second contact terminal 124 may be arranged at an end portion (close to a bottom wall 2*e*) of the cartridge 120 inserted into the accommodation space 116. Although the second contact terminal 124 arranged on a side wall 2*s* of the cartridge 120 is illustrated in FIG. 3, in another embodiment, the second contact terminal 124 may be arranged on the bottom wall 2*e* of the cartridge 120. Similarly, although the first contact terminal 117 arranged on a side wall is of the accommodation space 116 is illustrated in FIG. 3, in another embodiment, the first contact terminal 117 may be arranged on the bottom wall 1*e* of the accommodation space 116. As compared with a case where the first contact terminal 117 is arranged near the opening portion of the accommodation space 116, the first contact terminal 117 is arranged at the end portion opposite to the opening portion of the accommodation space 116 to prevent the first contact terminal 117 from being easily damaged due to friction with the cartridge 120.

The second contact terminal 124 may be formed to protrude from a body of the cartridge 120. The first contact terminal 117 may be at least partially pressed by the second contact terminal 124 as the cartridge 120 is coupled to the main body 110, so that the second conductive element 121 may be electrically connected to the capacitive sensor 113. For example, the first contact terminal 117 may be a c-clip type contact terminal, but is not limited thereto.

A portion of the side wall 2*s* of the cartridge 120 may be formed to protrude more than the second contact terminal 124. That is, a protruding length d1 of a portion of the side wall 2*s* of the cartridge 120 may be greater than a length d2 from which the second contact terminal 124 protrudes from the body of the cartridge 120. A space 116*s* generated between the cartridge 120 and the side wall 1*s* of the accommodation space 116 may be blocked from the outside by forming a portion of the side wall 2*s* of the cartridge 120 to protrude more than the second contact terminal 124.

The protruding length d1 of the portion of the side wall 2*s* of the cartridge 120 may be greater than a protruding length d3 of a portion of an opposite side wall 2*a*. In another embodiment, the portion of the side wall 2*s* of the cartridge 120 may be formed to protrude, and the opposite side wall 2*a* may be formed to be a flat surface without a protruding portion. By asymmetrically forming the side wall 2*s* and the opposite side wall 2*a* of the cartridge 120, the user may easily insert the cartridge 120 into the accommodation space 116 in a correct direction.

FIG. 4 is a diagram for explaining a method of activating a heater based on a time point at which an aerosol generating device (e.g. aerosol generating device 100) senses contact of a user, according to an embodiment.

A controller (e.g. controller 114) may control power supplied from a battery (e.g. battery 112) to a heater (e.g. heater 122) based on an order of a first time point t1 at which a capacitive sensor (e.g. capacitive sensor 113) senses contact of a user through a first conductive element (e.g. first conductive element 111), and a second time point t2 at which the capacitive sensor senses contact of the user through a second conductive element (e.g. second conductive element 121).

When the first time point t1 is before the second time point t2, the controller may control the power supplied from the battery to the heater such that the heater starts pre-heating or is activated. This case may correspond to a way in which the user holds the aerosol generating device and then bites a mouthpiece thereof. Accordingly, the controller may start pre-heating or activate the heater when the user holds the aerosol generating device and then bites the mouthpiece thereof.

When the first time point t1 is the same as or after the second time point t2, the controller may control the power supplied from the battery to the heater such that the heater does not start pre-heating and is not activated. This case may correspond to a case in which a hand-holding portion and a mouth-biting portion of the aerosol generating device are contacted at the same time or a case of which the hand-holding portion is contacted after the mouth-biting portion is contacted. Because this case is not generally seen as a way that the user uses the aerosol generating device for smoking, the controller may limit the start of pre-heating or the activation of the heater in this case.

When the first time point t1 is before the second time point t2 and when the capacitive sensor senses, through the first conductive element, that contact of the user is maintained from the first time point t1 to the second time point t2, the controller may control the power supplied from the battery to the heater such that the heater starts pre-heating or is activated. This case may correspond to a way in which the user bites the mouthpiece while continuously holding the aerosol generating device. Accordingly, the controller may start pre-heating or activate the heater when the user bites the mouthpiece while continuously holding the aerosol generating device.

When the first time point t1 is before the second time point t2 and when the second time point t2 is after a predetermined period p1 from the first time point t1, the controller may control the power supplied from the battery to the heater such that the heater starts pre-heating and is activated. This case may correspond to a way in which the user holds the aerosol generating device and moves the aerosol generating device toward mouth, and then bites the mouthpiece. The predetermined period p1 may correspond to an average time required for the user to move the aerosol generating device to mouth after holding the aerosol generating device. For example, the predetermined period p1 may be several seconds or tens of seconds, but is not limited thereto.

In another embodiment, the controller may control the power supplied from the battery to the heater based on an order of the first time point t1 at which the capacitive sensor senses contact of the user through the first conductive element, the second time point t2 and a third time point t3 at which the capacitive sensor senses contact of the user through each of the two second conductive elements.

The aerosol generating device may include two second conductive elements which respectively contacts the upper lip and the lower lip of the user. The two second conductive elements may be arranged on opposite surfaces of a cartridge. The second time point t2 and the third time point t3 may represent a time point at which the user's upper lip and lower lip respectively contact the two second conductive elements, respectively.

When the first time point t1 is before the second time point t2 and the third time point t3 and when the second time point t2 and third time point t3 are the same, the controller may control the power supplied from the battery to the heater such that the heater starts pre-heating or is activated.

This case may correspond to a way in which the user holds the aerosol generating device and both the upper lip and the lower lip are brought into contact with the mouthpiece. When the user bites the mouthpiece, the upper lip and the lower lip of the user contact the mouthpiece at the same time (or in a negligible difference). Accordingly, the controller may start pre-heating or activate the heater when the user holds the aerosol generating device and then contact both lips with the mouthpiece.

The controller may control the heater to start pre-heating or be activated based on the first time point t1, the second time point t2, and the third time point t3, so that the aerosol generating device may be activated only when the user contacts the aerosol generating device for smoking.

FIG. 5 is a flowchart illustrating an operation method of an aerosol generating device according to an embodiment.

In operation 510, a controller of the aerosol generating device may obtain a first time point at which a capacitive sensor senses contact of a user through a first conductive element. The first time point may correspond to a time point at which the user holds the aerosol generating device with a hand.

In operation 520, the controller of the aerosol generating device may obtain a second time point at which the capacitive sensor senses contact of the user through a second conductive element. The second time point may correspond to a time point at which the user bites the aerosol generating device.

In operation 530, the controller of the aerosol generating device may control power supplied from a battery to a heater based on an order of the first time point and the second time point. When the first time point is before the second time point (corresponding to a way in which the user holds the aerosol generating device and then bites a mouthpiece), the controller may control the power supplied from the battery to the heater such that the heater starts pre-heating or is activated. In addition, when the first time point is the same as or after the second time point (in a case which is not generally seen as a way that the user uses the aerosol generating device for smoking), the controller may control the power supplied from the battery to the heater such that the heater does not start pre-heating or is not activated.

FIG. 6 is a diagram for explaining an aerosol generating device according to another embodiment.

An aerosol generating device 200 may include a main body 210 and a cartridge 220.

The main body 210 may include an input interfacing unit 211, a battery 212, a capacitive sensor 213, and a controller 214. The input interfacing unit 211 may be a button, a sliding switch, a touch screen, a knob, or the like, but is not limited thereto.

The cartridge 220 may include a conductive element 221 and a heater 222. At least a portion of the cartridge 220 may form a mouthpiece 223. The conductive element 221 may be arranged on the mouthpiece 223. The conductive element 221 may be arranged at a portion of which a user bites the cartridge 220 with his or her lip.

The controller 214 may, when the capacitive sensor 213 senses contact of a user through the conductive element 221 after receiving a user input through the input interfacing unit 211, control power supplied from the battery 212 to the heater 222 such that the heater 222 starts pre-heating or is activated.

On the contrary, the controller 214 may, when a user input is received through the input interfacing unit 211 after the capacitive sensor 213 sensing contact of a user through the conductive element 221, control the power supplied from the battery 212 to the heater 222 such that the heater 222 does not start pre-heating or is activated.

Based on an operation of the user manipulating the input interfacing unit 211 and an operation of the user contacting the aerosol generating device 200, the heater 222 may be controlled to start pre-heating or be activated, so that the aerosol generating device 200 may be activated only when the user contacts the aerosol generating device 200 for smoking.

FIG. 7 is a diagram for explaining an aerosol generating device according to another embodiment.

An aerosol generating device 300 may include a main body 310 and a cartridge 320. In another embodiment, the aerosol generating device may only include the main body 310.

The main body 310 may include a plurality of conductive elements 311, a battery 312, a capacitive sensor 313, and a controller 314.

The cartridge 320 may include a heater 321. In another embodiment, the cartridge 320 may further include a conductive element.

The controller 314 may control power supplied from the battery 312 to the heater 321 based on an order in which the capacitive sensor 313 senses contact of a user through the plurality of conductive elements 311.

The controller 314 may, when the order, in which the capacitive sensor 313 senses contact of the user through the plurality of conductive elements 311, is a predetermined order, control the power supplied from the battery 312 to the heater 321 such that the heater 321 starts pre-heating or is activated. This case may correspond to a way in which the user contacts the plurality of conductive elements 311 in a particular order, such as when the user inputs a password. For example, when the user contacts the plurality of conductive elements 311 in an order of a first conductive element 311a, a third conductive element 311c, a second conductive element 311b, and a fourth conductive element 311d, the order being the same as the predetermined order, the controller 314 may control the power supplied from the battery 312 to the heater 321 such that the heater 321 starts pre-heating or is activated.

The heater 321 may be controlled to start pre-heating or be activated based on an operation of the user contacting the plurality of conductive elements 311 in a particular order, such as an order for unlocking a lock, such that the aerosol generating device 300 may be activated only when the user contacts the aerosol generating device 300 for smoking.

One embodiment may also be implemented in the form of a recording medium including instructions executable by a computer, such as a program module executable by the computer. The computer-readable recording medium may be any available medium that can be accessed by a computer, including both volatile and nonvolatile media, and both removable and non-removable media. In addition, the computer-readable recording medium may include both a computer storage medium and a communication medium. The computer storage medium includes all of volatile and non-volatile media, and removable and non-removable media implemented by any method or technology for storage of information such as computer-readable instructions, data structures, program modules or other data. The communication medium typically includes computer-readable instructions, data structures, other data in modulated data signals such as program modules, or other transmission mechanisms, and includes any information transfer media.

The descriptions of the above-described embodiments are merely examples, and it will be understood by one of ordinary skill in the art that various changes and equivalents thereof may be made.

The invention claimed is:

1. An aerosol generating device comprising:
a main body comprising a battery, a capacitive sensor, a controller, a first conductive element, and a first contact terminal; and
a cartridge comprising a second conductive element and a heater, and a second contact terminal that protrudes from the cartridge, wherein the cartridge is configured to be detachably coupled to the main body,
wherein the cartridge is configured to be electrically connected to the first contact terminal such that the second conductive element is electrically connected to the capacitive sensor, wherein the cartridge is configured to be detachably coupled to the main body, and
wherein the controller is configured to control power supplied from the battery to the heater based on an order of a first time point at which the capacitive sensor senses contact of a user through the first conductive element, and a second time point at which the capacitive sensor senses contact of the user through the second conductive element.

2. The aerosol generating device of claim 1, wherein
at least a portion of the cartridge forms a mouthpiece,
the second conductive element is arranged on the mouthpiece such that the capacitive sensor is able to sense contact of lips of the user on the mouthpiece via the second conductive element,
the main body further comprises a housing for holding by the user, and
the first conductive element is arranged on the housing such that the capacitive sensor is able to sense contact with a hand of the user on the housing via the first conductive element.

3. The aerosol generating device of claim 1, wherein
the first contact terminal is configured to be at least partially pressed by the second contact terminal as the cartridge is coupled to the main body, thereby electrically connecting the second conductive element to the capacitive sensor.

4. The aerosol generating device of claim 3, wherein at least a portion of a side wall of the cartridge, on which the second contact terminal is arranged, is formed to protrude more than the second contact terminal.

5. The aerosol generating device of claim 1, wherein
the main body further comprises an accommodation space that is configured to receive at least a portion of the cartridge, and
the first contact terminal is arranged at an end portion of the accommodation space, opposite to an opening portion of the accommodation space.

6. The aerosol generating device of claim 1, wherein the controller is configured to, based on the second time point being after the first time point, control the power from the battery to the heater such that the heater is activated.

7. The aerosol generating device of claim 1, wherein the controller is configured to, based on the first time point being at a same time as or a later time than the second time point, control the power from the battery to the heater such that the heater is not activated.

8. The aerosol generating device of claim 1, wherein the controller is configured to, based on the second time point being after the first time point and based on the capacitive sensor sensing, through the first conductive element, that contact of the user is maintained from the first time point to the second time point, control the power supplied from the battery to the heater such that the heater is activated.

9. The aerosol generating device of claim 1, wherein the controller is configured to, based on the second time point being after a predetermined time after the first time point, control the power supplied from the battery to the heater such that the heater is activated.

10. An operation method of an aerosol generating device, the operation method comprising:
   sensing, by the aerosol generating device, first contact of a user through a first conductive element of the aerosol generating device;
   sensing, by the aerosol generating device, second contact of the user through a second conductive element of the aerosol generating device;
   electrically connecting a first contact terminal of a main body of the aerosol generating device with a second contact terminal that protrudes from a cartridge, such that the second conductive element is electrically connected to a capacitive sensor of the main body, wherein the cartridge comprises a heater and is detachably coupled to the main body; and
   controlling, by the aerosol generating device, power supplied from a battery to the heater based on an order of a first time point at which the capacitive sensor senses contact of the user through the first conductive element, and a second time point at which the capacitive sensor senses contact of the user through the second conductive element.

11. The operation method of claim 10, wherein the controlling comprises controlling, based on the contact of the user through the second conductive element being sensed after the contact of the user through the first conductive element, the power supplied from the battery to the heater such that the heater is activated.

12. The operation method of claim 10, wherein the controlling comprises controlling, based on the contact of the user through the first conductive element being sensed at a same time as or a later time than the contact of the user through the second conductive element, the power supplied from the battery to the heater such that the heater is not activated.

* * * * *